(12) United States Patent
Sonoda et al.

(10) Patent No.: US 9,653,702 B2
(45) Date of Patent: May 16, 2017

(54) ELECTROLUMINESCENT DEVICE

(71) Applicant: Sharp Kabushiki Kaisha, Sakai-shi, Osaka (JP)

(72) Inventors: Tohru Sonoda, Sakai (JP); Takeshi Hirase, Sakai (JP); Tetsuya Okamoto, Sakai (JP); Tohru Senoo, Sakai (JP); Seiji Fujiwara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/112,226

(22) PCT Filed: Feb. 3, 2015

(86) PCT No.: PCT/JP2015/052897
§ 371 (c)(1),
(2) Date: Jul. 18, 2016

(87) PCT Pub. No.: WO2015/119086
PCT Pub. Date: Aug. 13, 2015

(65) Prior Publication Data
US 2016/0343981 A1 Nov. 24, 2016

(30) Foreign Application Priority Data

Feb. 10, 2014 (JP) .................................. 2014-023491

(51) Int. Cl.
*H01L 33/00* (2010.01)
*H01L 51/52* (2006.01)
*H01L 51/00* (2006.01)
*H01L 27/32* (2006.01)

(52) U.S. Cl.
CPC ...... *H01L 51/5246* (2013.01); *H01L 51/0097* (2013.01); *H01L 51/5253* (2013.01); *H01L 27/3244* (2013.01); *H01L 51/524* (2013.01); *H01L 51/5256* (2013.01)

(58) Field of Classification Search
CPC ............. H01L 51/5246; H01L 51/0097; H01L 51/5253; H01L 51/524; H01L 51/5256; H01L 27/3244
See application file for complete search history.

(56) References Cited

U.S. PATENT DOCUMENTS

| | | | |
|---|---|---|---|
| 2009/0273589 A1 | 11/2009 | Asano et al. | |
| 2010/0181902 A1* | 7/2010 | Kita | G02F 1/1341 313/504 |
| 2010/0187986 A1 | 7/2010 | Kajitani et al. | |

(Continued)

FOREIGN PATENT DOCUMENTS

| | | |
|---|---|---|
| CN | 101853875 A | 10/2010 |
| JP | 2009-037812 A | 2/2009 |
| JP | 2013-077382 A | 4/2013 |

*Primary Examiner* — Victor A Mandala
(74) *Attorney, Agent, or Firm* — Keating & Bennett, LLP

(57) ABSTRACT

In an organic EL display device (electroluminescent device) including an organic EL element (electroluminescent element), a sealing film is provided to seal the organic EL element, and a projection (preventing portion) is configured to prevent the sealing film from peeling off and to have an inclined plane forming an obtuse angle with a light emitting surface of the organic EL element. The projection is provided only in a non-light emitting region of the organic EL element.

10 Claims, 14 Drawing Sheets

(56) References Cited

U.S. PATENT DOCUMENTS

| | | | |
|---|---|---|---|
| 2014/0183473 A1* | 7/2014 | Lee | H01L 51/0097 257/40 |
| 2015/0068600 A1* | 3/2015 | Fujimoto | C23C 16/401 136/259 |
| 2015/0236263 A1* | 8/2015 | Osaki | H01L 51/0029 438/26 |

* cited by examiner

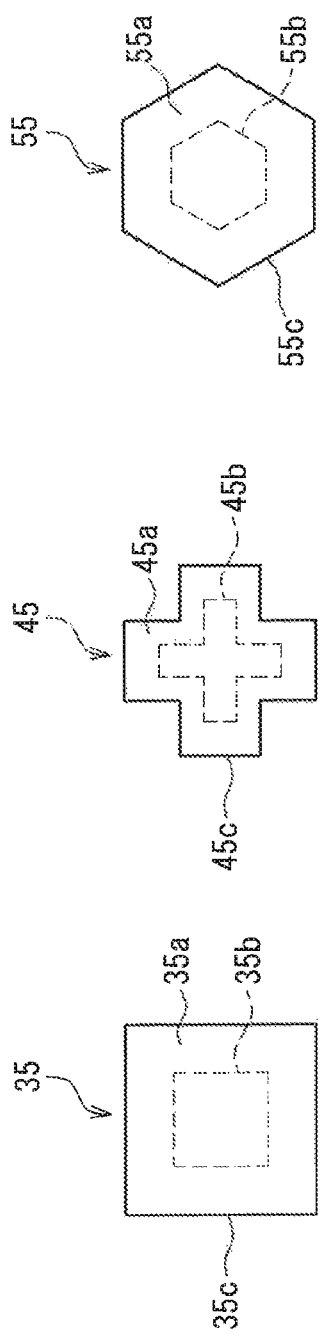
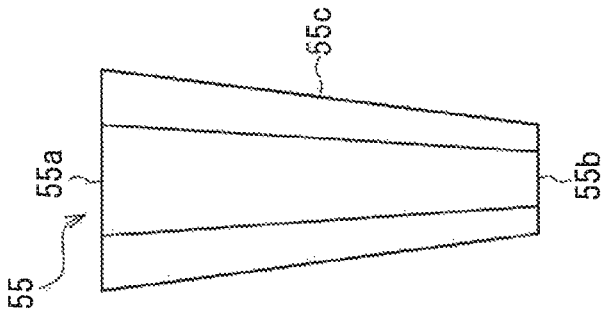
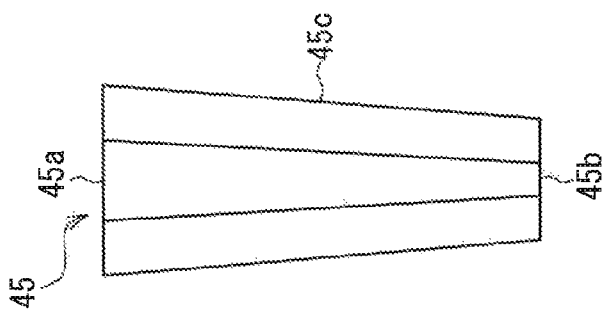
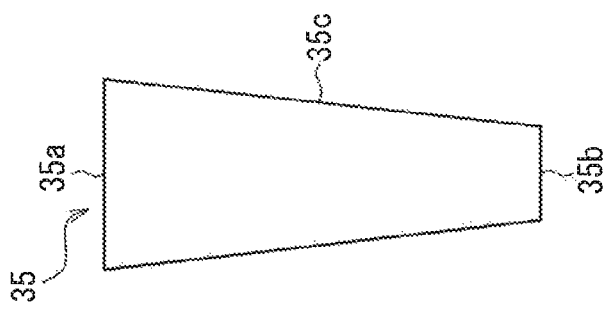

ELECTROLUMINESCENT DEVICE

TECHNICAL FIELD

The present invention relates an electroluminescent device including an EL (electroluminescent) element.

BACKGROUND ART

In recent years, flat panel displays have been widely used in various commodities and fields, and the flat panel displays are required to have a larger size, a higher image quality, and a lower power consumption.

Under these circumstances, an organic EL display device is attracting considerable attention as an all-solid-state flat panel display with excellent low-voltage driving capability, high-speed responsibility, and self-luminous property. The organic EL display device includes an organic EL element that utilizes the electroluminescence of an organic material.

In an active matrix type organic EL display device, e.g., a thin-film organic EL element is provided on a substrate having TFTs (thin-film transistors). The organic EL element includes an organic EL layer (including a light emitting layer) that is disposed between a pair of electrodes. The TFTs are connected to one of the pair of electrodes. A voltage is applied across the pair of electrodes so that the light emitting layer emits light, thereby displaying images.

In the above conventional organic EL display device, a sealing film in which an organic layer and an inorganic layer are alternately stacked is formed on the organic EL element, as proposed by, e.g., Patent Document 1. Due to the presence of the sealing film, the conventional organic EL display device can prevent the degradation of the organic EL element caused by moisture or oxygen.

PRIOR ART DOCUMENTS

Patent Documents

Patent Document 1: JP 2009-37812 A

DISCLOSURE OF INVENTION

Problem to be Solved by the Invention

However, in the above conventional organic EL display device (electroluminescent device), there is a problem that the sealing film may peel off the organic EL element (electroluminescent element).

With the foregoing in mind, it is an object of the present invention to provide an electroluminescent device that can prevent the occurrence of peeling of a sealing film.

Means for Solving Problem

To achieve the above object, an electroluminescent device of the present invention includes a substrate and an electroluminescent element provided on the substrate. The electroluminescent device includes a sealing film that seals the electroluminescent element, and a preventing portion that is configured to prevent the sealing film from peeling off and to have an inclined plane forming an obtuse angle with a light emitting surface of the electroluminescent element. The preventing portion is provided only in a non-light emitting region of the electroluminescent element.

In the electroluminescent device having the above configuration, the preventing portion that is configured to prevent the sealing film from peeling off and to have an inclined plane forming an obtuse angle with the light emitting surface of the electroluminescent element is provided only in the non-light emitting region of the electroluminescent element. Thus, unlike the conventional example, the electroluminescent device can prevent the occurrence of peeling of the sealing film.

In the electroluminescent device, it is preferable that the preventing portion includes a plurality of projections that are covered with the sealing film and project in the direction from the electroluminescent element to the sealing film.

In this case, the plurality of projections can reliably prevent the occurrence of peeling of the sealing film.

In the electroluminescent device, it is preferable that the plurality of projections of the preventing portion are provided for each subpixel in the electroluminescent element.

In this case, the plurality of projections are provided for each subpixel, and therefore can more reliably prevent the occurrence of peeling of the sealing film.

In the electroluminescent device, it is preferable that the plurality of projections of the preventing portion are provided for each subpixel so that an area ratio Sr of the inclined plane calculated by the following formula (1) is 3% or more:

$$Sr=(S1-S2)/S3 \tag{1}$$

where S1 represents an area of surfaces of the projections that face the sealing film, S2 represents an area of surfaces of the projections that face the electroluminescent element, and S3 represents an area of the subpixel.

This can reliably prevent a reduction in the function of the projections to prevent the sealing film from peeling off and also can reliably prevent the occurrence of peeling of the sealing film.

In the electroluminescent device, it is preferable that when the preventing portion includes three or more projections for each subpixel, the three or more projections are placed with their respective centers not being located on the same line.

This can improve the function of the projections to prevent the sealing film from peeling off and can more reliably prevent the occurrence of peeling of the sealing film.

In the electroluminescent device, it is preferable that the light emitting surface of the electroluminescent element includes a standard light emitting surface and an inclined light emitting surface that is continuously formed on an end face of the standard light emitting surface, and is inclined with respect to the standard light emitting surface. Moreover, it is preferable that the density of placement of the projections of the preventing portion is larger in a boundary portion between the standard light emitting surface and the inclined light emitting surface than in a portion of the standard light emitting surface other than the boundary portion and a portion of the inclined light emitting surface other than the boundary portion.

This can prevent the occurrence of peeling of the sealing film even if the light emitting surface of the electroluminescent element includes the standard light emitting surface and the inclined light emitting surface.

The electroluminescent device may include a counter substrate that is located opposite the substrate, and a sealing material that is provided between the substrate and the counter substrate. The electroluminescent element may be sealed by the substrate, the counter substrate, and the sealing material.

In this case, it is possible to further prevent moisture or oxygen from entering the electroluminescent element from the outside, and to further reduce the degradation of the electroluminescent element caused by moisture or oxygen.

In the electroluminescent device, the substrate and the counter substrate may be flexible substrates.

In this case, the electroluminescent device can have flexibility.

In the electroluminescent device, the sealing film may include an inorganic layer and an organic layer that are stacked one on top of the other.

In this case, the sealing film can have a rigid structure, while improving the sealing function.

In the electroluminescent device, it is preferable that the sealing film has a thickness of 2 μm or more.

In this case, the sealing film can reliably seal the electroluminescent element.

Effects of the Invention

The present invention can provide an electroluminescent device that can prevent the occurrence of peeling of a sealing film.

BRIEF DESCRIPTION OF DRAWINGS

FIGS. 14C and 14D are a plan view and a side view of Modified Example 2 of the projection, respectively. FIGS. 14E and 14F are a plan view and a side view of Modified Example 3 of the projection, respectively.

DESCRIPTION OF THE INVENTION

Figure 1:
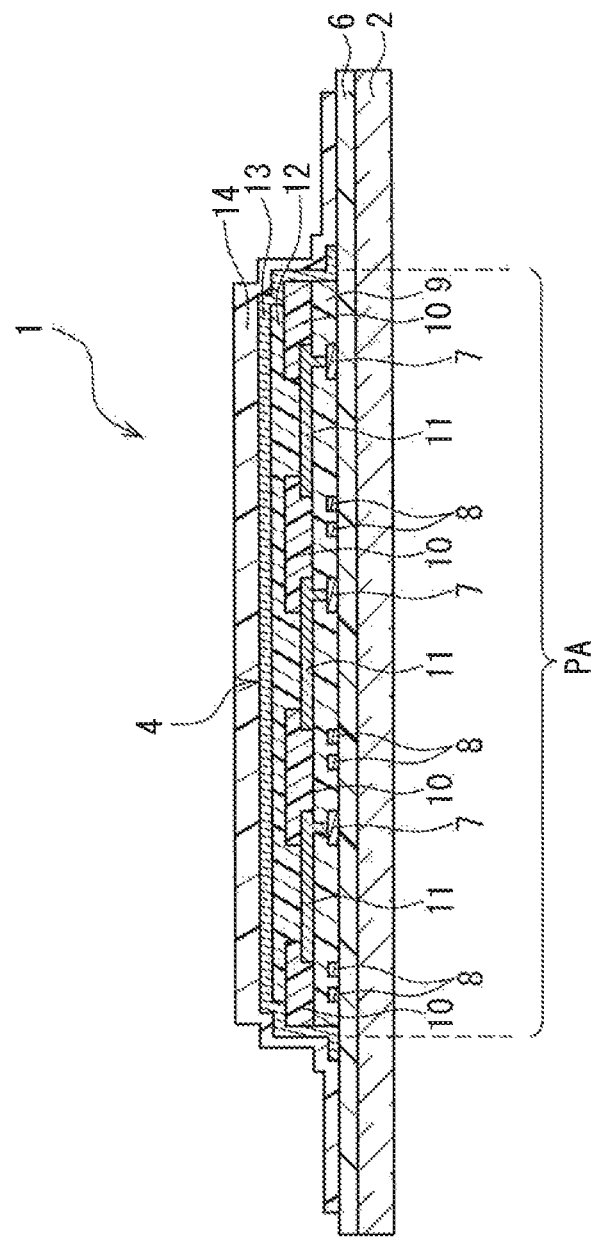
FIG. 1 is a cross-sectional view illustrating a cross section in light emitting regions of an organic EL display device of Embodiment 1 of the present invention.

Hereinafter, preferred embodiments of an electroluminescent device of the present invention will be described with reference to the drawings. In the following description, the present invention is applied to an organic EL display device. The size and size ratio of each of the constituent members in the drawings may not exactly represent those of the actual constituent members.

[Embodiment 1]

Figure 2:
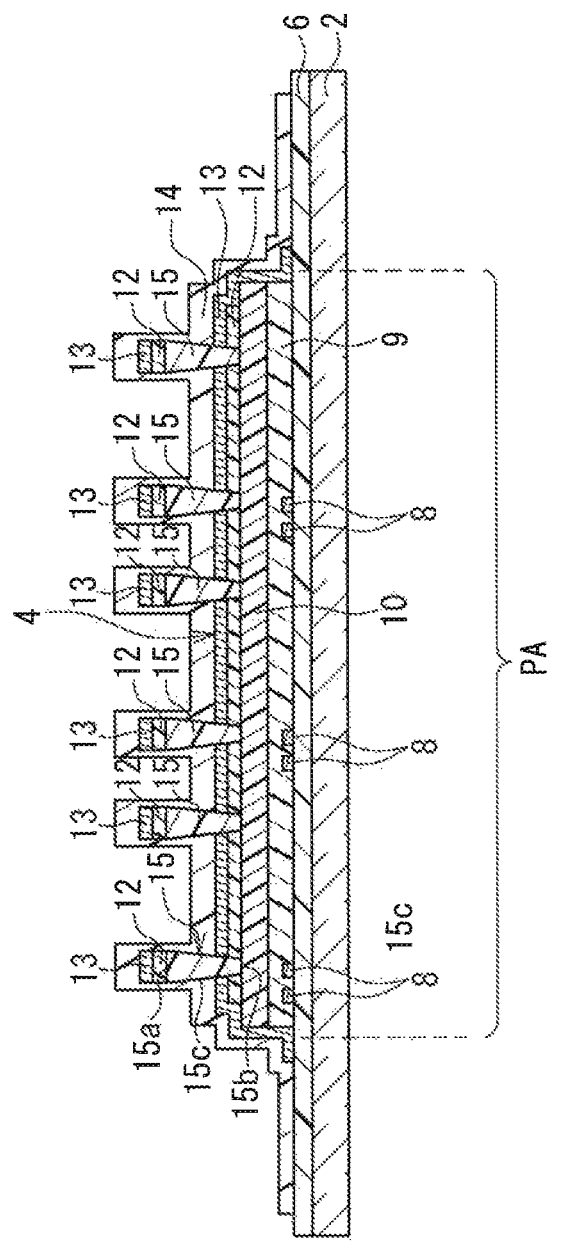
FIG. 2 is a cross-sectional view illustrating a cross section in a non-light emitting region of the organic EL display device.

FIG. 1 is a cross-sectional view illustrating a cross section in light emitting regions of an organic EL display device of Embodiment 1 of the present invention. FIG. 2 is a cross-sectional view illustrating a cross section in a non-light emitting region of the organic EL display device. In FIG. 1, an organic EL display device 1 of this embodiment includes a TFT substrate (substrate) 2 and an organic EL element (electroluminescent element) 4 provided on the TFT substrate 2.

In the organic EL display device 1 of this embodiment, the organic EL element 4 forms a rectangular pixel region PA having a plurality of pixels (including a plurality of subpixels), and the organic EL element 4 is sealed by a sealing film 14. The pixel region PA is a display portion of the organic EL display device 1 and displays information. In the pixel region PA, the pixels (subpixels) are arranged in a matrix, and the organic EL element 4 emits light for each subpixel so that information is displayed, as will be described in detail later.

In FIG. 1, the TFT substrate 2 is made of, e.g., a glass material. An underlying film (insulating film) 6 is formed on the TFT substrate 2 to cover the entire surface of the TFT substrate 2. As illustrated in FIG. 1, in the light emitting regions of the organic EL display device 1, TFTs (thin-film transistors) 7 are provided on the underlying film 6 so as to correspond to each subpixel in the pixel region PA. Moreover, lines 8 are formed on the underlying film 6. The lines 8 include a plurality of source lines (signal lines) and a plurality of gate lines that are arranged in a matrix. The source lines are connected to a source driver (not shown) and the gate lines are connected to a gate driver (not shown). With this configuration, the TFTs 7 are driven on a subpixel-by-subpixel basis in accordance with an external input image signal. The TFTs 7 function as switching elements that control the light emission of the corresponding subpixels. Thus, the TFTs 7 control the light emission of any of red (R), green (G), and blue B subpixels of the organic EL element 4.

The underlying film 6 prevents the properties of the TFTs 7 from being reduced due to the diffusion of impurities from the TFT substrate 2 to the TFTs 7. If there is no concern for such a reduction in the properties of the TFTs 7, then the formation of the underlying film 6 may be omitted.

As illustrated in FIG. 1, an interlayer insulating film 9, an edge cover 10, and a first electrode 11 of the organic EL element 4 are formed on the TFT substrate 2. The interlayer insulating film 9 functions as a planarization film and is formed on the underlying film 6 to cover the TFTs 7 and the lines 8. The edge cover 10 is formed on the interlayer insulating film 9 to cover the pattern edges of the first electrode 11. The edge cover 10 also functions as an insulating layer to prevent a short circuit between the first electrode 11 and a second electrode 13 (as will be described later). Moreover, the first electrode 11 is connected to the TFT's 7 via contact holes provided in the interlayer insulating film 9.

The edge cover 10 has openings, through which the first electrode 11 is exposed, and these portions substantially form the light emitting regions of the organic EL element 4. As described above, the organic EL display device 1 of this embodiment is configured to perform full-color display by emitting light of any color of RGB. The organic EL display device 1 of this embodiment is an active matrix type display device with the TFTs (thin-film transistors) 7.

As illustrated in FIG. 1, an organic EL layer 12 and a second electrode 13 are formed on the first electrode 11. The first electrode 11, the organic EL layer 12, and the second electrode 13 constitute the organic EL element 4. The organic EL element 4 is, e.g., a light emitting element that is driven by low voltage direct current and can emit high-intensity light. The organic EL element 4 includes the first electrode 11, the organic EL layer 12, and the second electrode 13.

Specifically, when the first electrode 11 is a positive electrode, a hole injection layer, a hole transport layer, a light emitting layer, an electron transport layer, an electron injection layer, etc. (not shown) are formed in this order on the first electrode 11 as the organic EL layer 12, on top of which the second electrode (negative electrode) 13 is formed. Other than the above description, a single layer may have two or more functions such as a hole injection and transport layer. Moreover, a carrier blocking layer or the like may be appropriately inserted into the organic EL layer 12.

On the other hand, when the second electrode 13 is a positive electrode, the order in which the layers are stacked as the organic EL layer 12 is reversed.

When the first electrode 11 is a permeable electrode or a semi-permeable electrode, and the second electrode 13 is a reflecting electrode, the organic EL display device 1 is a bottom emission type device that emits light from the TFT substrate 2. In the bottom emission type organic EL display device 1, the surface of the first electrode 11 that faces the TFT substrate 2 is substantially a light emitting surface of the organic EL element 4, and light is emitted from the light emitting surface to the outside.

On the contrary, when the first electrode 11 is a reflecting electrode, and the second electrode 13 is a permeable electrode or a semi-permeable electrode, the organic EL display device 1 is a top emission type device that emits light from the sealing film 14. In the top emission type organic EL display device 1, the surface of the first electrode 11 that faces the sealing film 14 is substantially a light emitting surface of the organic EL element 4, and light is emitted from the light emitting surface to the outside.

In the organic EL display device 1 of this embodiment, the organic EL element 4 is sealed by the sealing film 14, as described above. The sealing film 14 prevents moisture or oxygen from permeating (entering) the organic EL element 4 from the outside, and thus prevents the degradation of the organic EL element 4.

As illustrated in FIG. 2, the underlying film 6 and the organic EL element 4 are provided in this order on the TFT substrate 2 in the non-light emitting region of the organic EL display device 1. Only the signal lines 8, the interlayer insulating film 9, the edge cover 10, the organic EL layer 12, and the second electrode 13 of the organic EL element 4 are located in the non-light emitting region. Moreover, in the non-light emitting region, a plurality of projections 15 are provided for each subpixel and placed in the form of islands to prevent the sealing film 14 from peeling off (as will be described in detail later).

Next, referring also to FIG. 3, the main configuration of the organic EL display device 1 of this embodiment will be described in detail.

Figure 3:
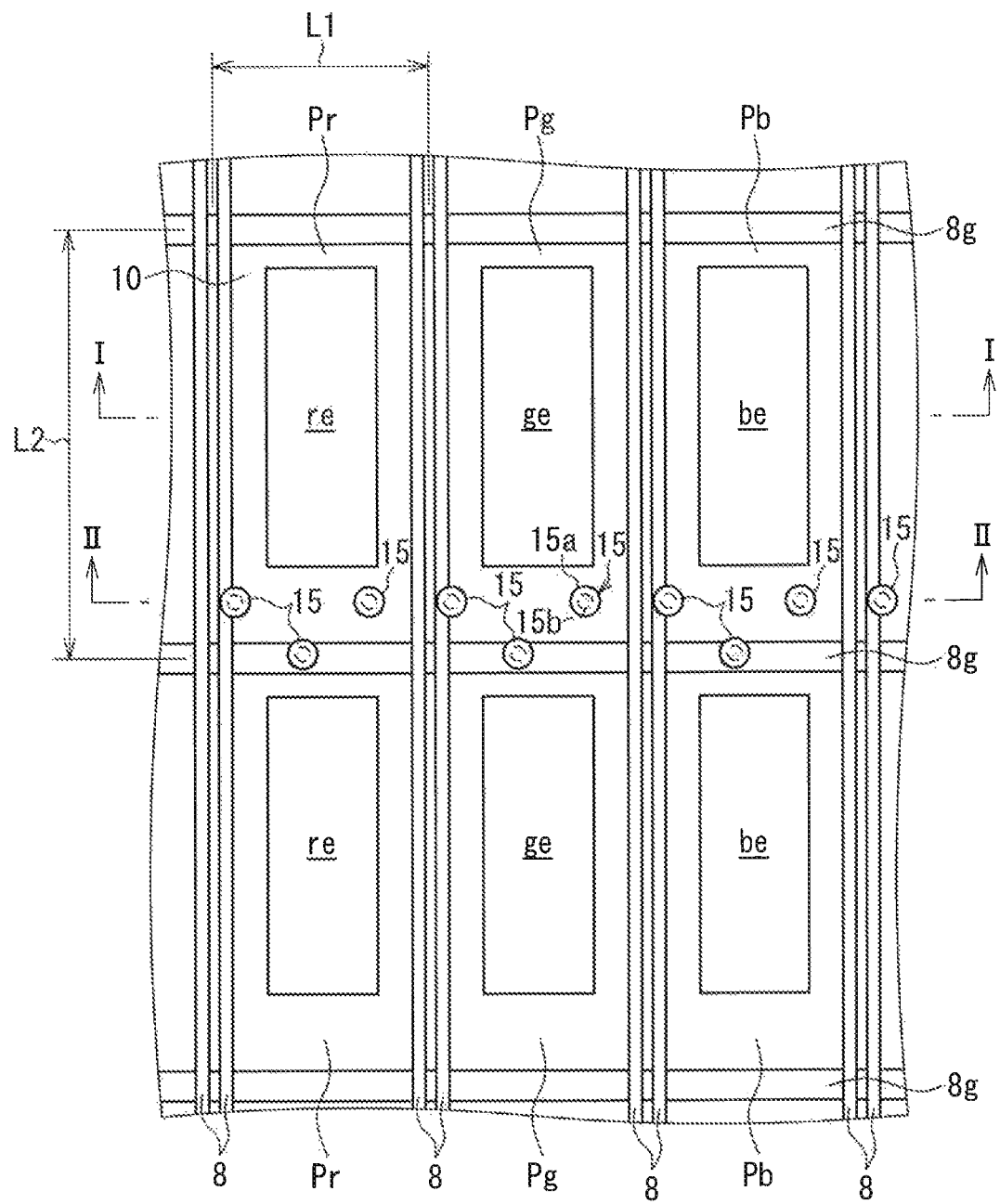
FIG. 3 is an enlarged plan view illustrating the main configuration of the organic EL display device.

FIG. 3 is an enlarged plan view illustrating the main configuration of the organic EL display device. FIGS. 1 and 2 are cross-sectional views taken along the line I-I and the line II-II in FIG. 3, respectively As illustrated in FIG. 3, red, green, and blue subpixels Pr, Pg, and Pb (which are collectively called subpixels P in the following) for emitting red (R), green (G), and blue B colors of light, respectively, are arranged in a matrix in the pixel region PA (FIG. 1) of the organic EL display device 1 of this embodiment. The subpixels P are separated from one another by two signal lines 8 and a gate line 8g that is connected to the gates of the TFTs 7. Specifically, the size of each subpixel P in the horizontal direction of FIG. 3 is a length (represented by "L1" in FIG. 3) measured from the center line between two proximity signal lines 8 to the center line between two proximity signal lines 8 that are adjacent to those proximity signal lines 8 in the horizontal direction of FIG. 3. Moreover, the size of each subpixel P in the vertical direction of FIG. 3 is a length (represented by "L2" in FIG. 3) measured between the centers of two gate lines 8g that are adjacent to each other in the vertical direction of FIG. 3. The area of the pixel region of each subpixel P is defined by the horizontal size and the vertical size, as illustrated in FIG. 3.

In the pixel region PA, a set of red, green, and blue subpixels Pr, Pg, and Pb forms one pixel.

A portion of a red subpixel Pr that is exposed to an opening re of the edge cover 10 is substantially a light emitting region of the red subpixel Pr. Similarly, a portion of a green subpixel Pg that is exposed to an opening ge of the edge cover 10 is substantially a light emitting region of the green subpixel Pg. Moreover, a portion of a blue subpixel Pb that is exposed to an opening be of the edge cover 10 is substantially a light emitting region of the blue subpixel Pb.

As illustrated in FIG. 3, e.g., three projections 15 are provided for each subpixel P in the non-light emitting region between two vertically adjacent subpixels P in FIG. 3. These projections 15 are contained in a preventing portion that prevents the sealing film 14 from peeling off and are provided only in the non-light emitting region. The projections 15 are, e.g., cylindrical in shape. As illustrated in FIG. 2, the projections 15 are covered with the sealing film 14 and project in the direction from the organic EL element 4 to the sealing film 14. Specifically, each of the projections 15 has a reverse tapered shape composed of a circular upper surface 15a that is in contact with the organic EL layer 12, a circular lower surface 15b that is concentric with the upper surface 15a and is in contact with the edge cover 10, and an inclined plane 15c that forms an obtuse angle with the light emitting surface of the organic EL element 4. Each of the projections 15 exerts an anchor effect on the sealing film 14 by the inclined plane 15c and can prevent the sealing film 14 from peeling off (as will be described in detail later).

The projections 15 are made of, e.g., a photosensitive resin. The height of the projections 15 from the edge cover 10 is set to, e.g., 5 to 10 μm. In the organic EL display device 1 of this embodiment, the projections 15 are formed on the edge cover 10 by, e.g., photolithography, and then the organic EL layer 12, the second electrode 13, and the sealing film 14 are formed in this order to cover the edge cover 10 and the projections 15.

In the organic EL display device 1 of this embodiment, three projections 15 in each subpixel P are configured so that an area ratio Sr of the inclined plane 15c calculated by the following formula (1) is 3% or more. This can ensure that a reduction in the anchor effect of the projections 15 is prevented, and thus can reliably prevent the occurrence of peeling of the sealing film 14.

$$Sr=(S1-S2)/S3 \tag{1}$$

where S1 represents the sum of the areas of the surfaces of three projections 15 that face the sealing film 14, i.e., the sum of the areas of the upper surfaces 15a, S2 represents the sum of the areas of the surfaces of three projections 15 that face the organic EL element 4, i.e., the sum of the areas of the lower surfaces 15b, and S3 represents the area of the pixel region of the subpixel P (i.e., the product of the horizontal size (represented by "L1" in FIG. 3) and the vertical size (represented by "L2" in FIG. 3) of the subpixel P). The surface ratio Sr can be appropriately adjusted by, e.g., the height (thickness) of the projections 15, the inclination angle (taper angle) of the inclined plane 15c, and the size and number of the projections 15.

The inclination angle is set to, e.g., 100 to 150 degrees (obtuse angle) with respect to the light emitting surface of the organic EL element 4.

In the organic EL display device 1 of this embodiment, three projections 15 are provided for each subpixel P so that their respective centers are not located on the same line (as will be described in detail later).

Next, referring also to FIG. 4, the sealing film 14 will be described in detail.

Figure 4:
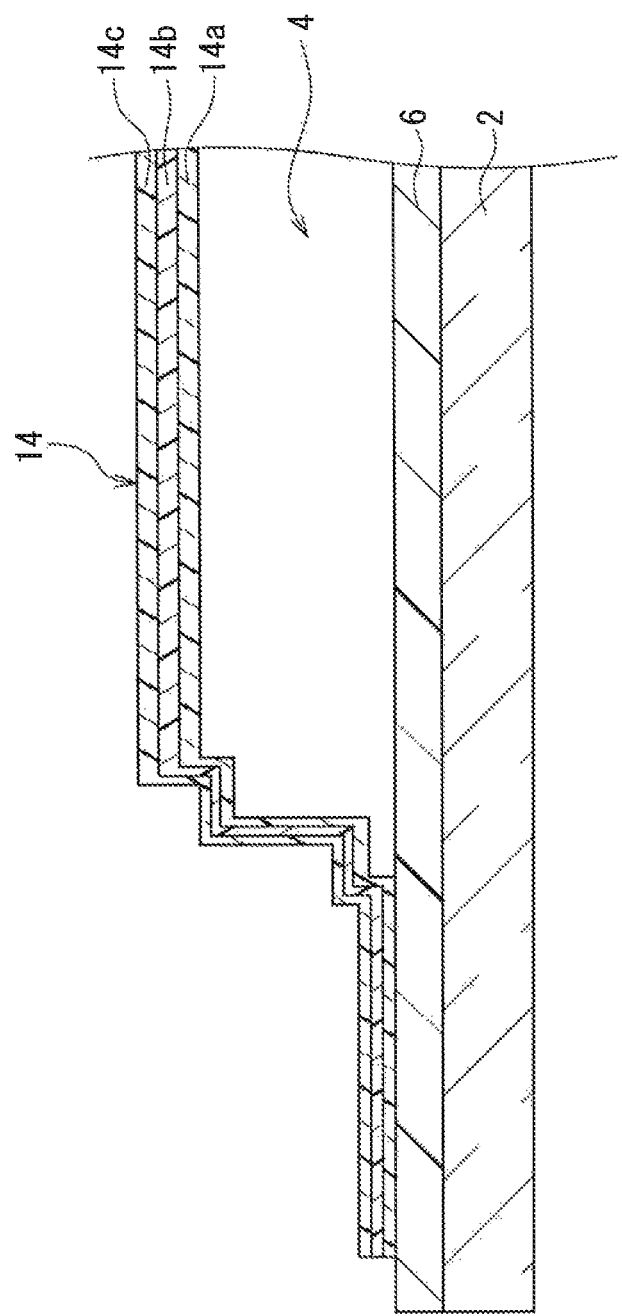
FIG. 4 is an enlarged cross-sectional view illustrating a specific configuration example of the sealing film in FIG. 1.

FIG. 4 is an enlarged cross-sectional view illustrating a specific configuration example of the sealing film in FIG. 1.

In FIG. 4, the sealing film 14 has a laminated structure of an inorganic layer and an organic layer, and is designed to prevent moisture or oxygen from permeating (entering) the organic EL element 4 from the outside as much as possible, thereby minimizing the degradation of the organic EL element 4. Specifically, as illustrated in FIG. 4, the sealing film 14 includes, e.g., a first inorganic layer 14a, an organic layer 14b, and a second inorganic layer 14c so that the organic EL element 4 is successively covered with these layers. The first inorganic layer 14a, the organic layer 14b, and the second inorganic layer 14c are formed by, e.g., a CVD method, a sputtering method, or an ALD (atomic layer deposition) method.

The first and second inorganic layers 14a, 14c are made of, e.g., silicon nitride, silicon oxide, silicon oxynitride, or aluminum oxide. The organic layer 14b is made of, e.g., silicon oxycarbide, acrylate, polyurea, parylene, polyimide, or polyamide. Due to the laminated structure of the first inorganic layer 14a, the organic layer 14b, and the second inorganic layer 14c, the sealing film 14 can have a rigid structure, while improving the sealing function.

The total thickness of the sealing film 14 is 2 μm or more. Therefore, the sealing film 14 can reliably seal the organic EL element 4. Moreover, the thickness of the first inorganic layer 14a of the sealing film 14 is smaller than the height of the projections 15. Thus, when the first inorganic layer 14a is formed after the projections 15 have been placed, it is possible not only to prevent the generation of a gap between the first inorganic layer 14a and the inclined plane 15c of each of the projections 15, but also to easily maintain the reverse tapered shape of the projections 15. More specifically, if the thickness of the first inorganic layer 14a is larger than the height of the projections 15, it is likely that a gap will be naturally generated between the first inorganic layer 14a and the inclined plane 15c of each of the projections 15 by membrane stress of the first inorganic layer 14a. Moreover, the reverse tapered projections 15 will be buried under the first inorganic layer 14a, which results in a smooth surface of the first inorganic layer 14a. This makes it difficult to exert the anchor effect of the projections 15 on the organic layer 14b and the second inorganic layer 14c.

Next, referring to FIGS. 5 and 6, the anchor effect of the projections 15 will be described in detail.

Figure 5:
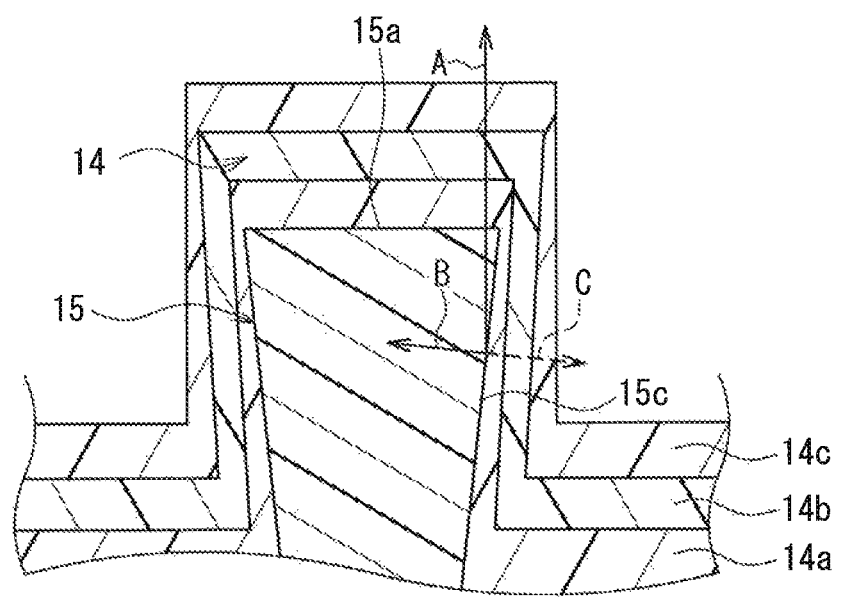
FIG. 5 is a diagram illustrating the anchor effect of a projection on the sealing film in FIG. 1.
Figure 6A:
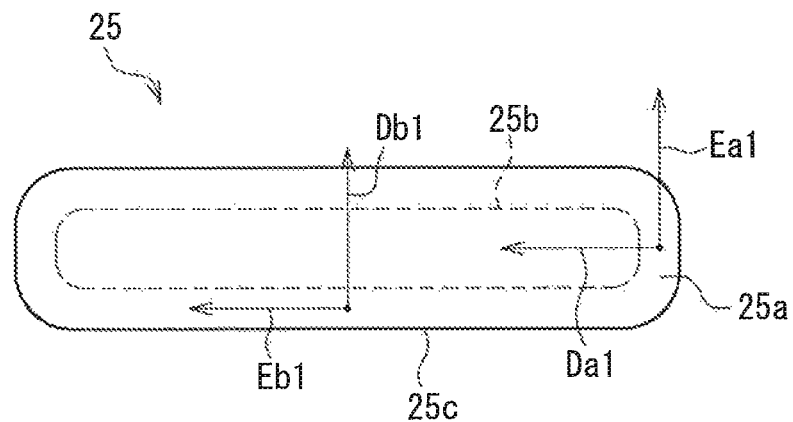
FIG. 6A is a diagram illustrating the anchor effect in Comparative Example 1.
Figure 6B:
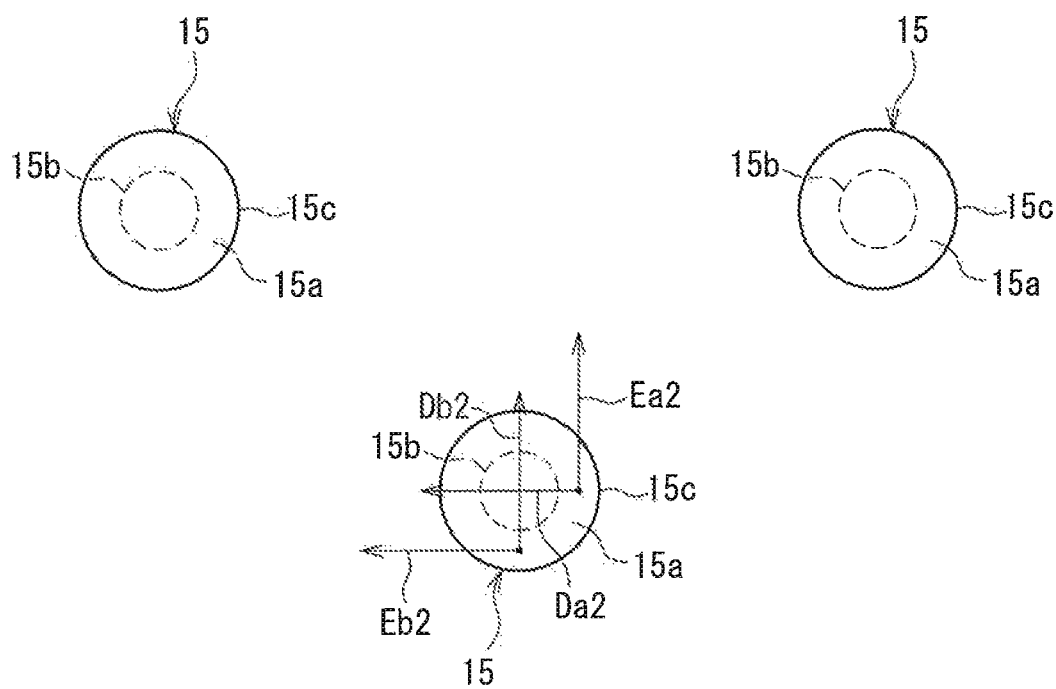
FIG. 6B is a diagram illustrating the anchor effect in the device of this embodiment.

FIG. 5 is a diagram illustrating the anchor effect of a projection on the sealing film in FIG. 1. FIG. 6A is a diagram illustrating the anchor effect in Comparative Example 1. FIG. 6B is a diagram illustrating the anchor effect in the device of this embodiment.

If a peel force is applied to peel the sealing film 14 away, as indicated by the arrow A in FIG. 5, the peel force acts as a deformation force on the projection 15 and the sealing film 14, as indicated by the arrow B and the arrow C in FIG. 5, respectively. However, the projection 15 and the sealing film 14 withstand the corresponding deformation forces due to their rigidity, so that peeling of the sealing film 14 can be prevented. In the organic EL display device 1 of this embodiment, the deformation forces are received by the rigidity of the projection 15 and the sealing film 14. This can prevent the occurrence of peeling in portions with low adhesion of films caused by, e.g., an increase in membrane stress with increasing the thickness of the sealing film 14, or thermal stress that is derived from a difference in thermal expansion coefficient between the materials. The portions with low adhesion of films may include, e.g., a portion between the first electrode 11 and the organic EL layer 12, a portion between each of the layers of the organic EL layer 12, and a portion between the second electrode 13, the organic EL layer 12, and the sealing film 14.

As illustrated in FIG. 6A, each subpixel may have a single projection 25 as a preventing portion. The projection 25 has a reverse tapered shape composed of an upper surface 25a that is in contact with the organic EL layer 12, a circular lower surface 25b that is in contact with the edge cover 10, and an inclined plane 25c that forms an obtuse angle with the light emitting surface of the organic EL element 4. Although such a single projection 25 can prevent the sealing film 14 from peeling off the use of a plurality of, e.g., three projections 15 in this embodiment, as illustrated in FIG. 6B, is preferred for the following reasons: (i) the deformation force applied to the projections (preventing portion) 15 can easily be made uniform in either direction; (ii) the area ratio Sr of the inclined plane 15c of the projections 15 can be improved; and (iii) the resistance to the peel force, i.e., the anchor effect of the preventing portion can be improved.

Specifically, when the peel force is diagonally applied with respect to the light emitting surface of the organic EL element 4 (i.e., the display surface of the organic EL display device 1), not only a force perpendicular to the light emitting surface, but also a force parallel to the light emitting surface is generated. Then, a component perpendicular to the inclined plane of the preventing portion acts as a deformation force, while a component parallel to the inclined plane of the preventing portion acts as a shear force.

Therefore, when the projection 25 (FIG. 6A) is provided for each subpixel P, since the shape of the projection 25 is not uniform in two directions of the light emitting surface (i.e., the vertical direction and the horizontal direction of FIG. 6A), the resistance to the peel force also becomes non-uniform in the two directions. When the peel force is diagonally applied with respect to the light emitting surface, a force parallel to the pixel surface is divided into a deformation force perpendicular to the inclined plane 25c of the projection 25 and a shear force parallel to the inclined plane 25c of the projection 25. Accordingly, a shear force Ea1 and a deformation force Da1 act on the inclined plane 25c of the side (short side) parallel to the vertical direction of FIG. 6A. The area of the inclined plane 25c on this short side is small, and thus the resistance to the deformation force Da1 is reduced. On the other hand, a shear force Eb1 and a deformation force Db1 act on the inclined plane 25c of the side (long side) parallel to the horizontal direction of FIG. 6A. The area of the inclined plane 25c on this long side is larger than that of the inclined plane 25c on the short side, and thus the resistance to the deformation force Db1 is increased. Consequently, the use of the projection 25 makes the resistance to the peel force non-uniform in the vertical direction and the horizontal direction of FIG. 6A.

In contrast, when three projections 15 (FIG. 6B) are provided for each subpixel P, the area of the inclined plane 15c of each of the projections 15 can easily be made uniform in both the vertical direction and the horizontal direction of FIG. 6B. In this case, a shear force Ea2 and a deformation force Da2 act on the inclined plane 15c of a portion parallel to the vertical direction of FIG. 6B. Moreover, a shear force Eb2 and a deformation force Db2 act on the inclined plane 15c of a portion parallel to the horizontal direction of FIG. 6B. Since the area of the inclined plane 15c of each of the projections 15 is uniform in both directions, the resistance to the peel force can also be uniform in both directions. Moreover, the area ratio Sr of the inclined plane 15c of the projections 15 can be improved, so that the resistance to the peel force can also be improved. Further, the same resistance to the peel force (anchor effect) can be obtained in any direction of the light emitting surface because of the use of the cylindrical projections 15.

Next, referring to FIG. 7, the effect of three projections 15 that are placed with their respective centers not being located on the same line will be described in detail.

Figure 7A:
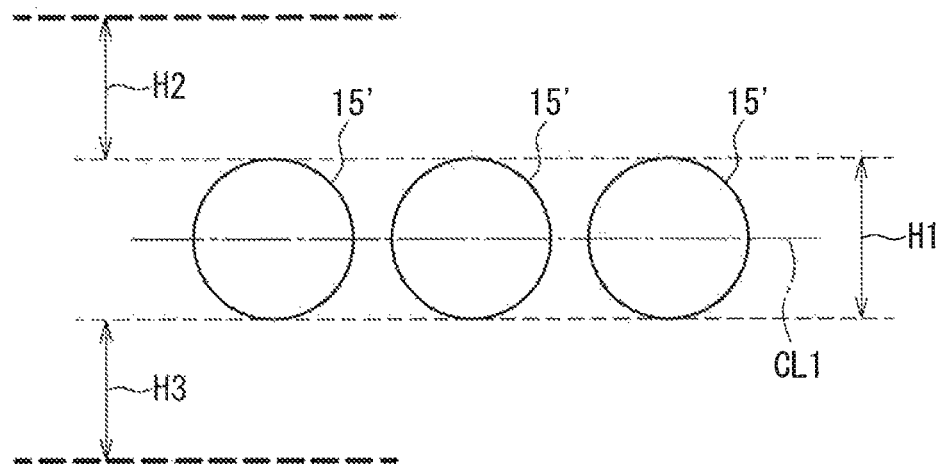
FIG. 7A is a diagram illustrating the anchor effect in Comparative Example 2.
Figure 7B:
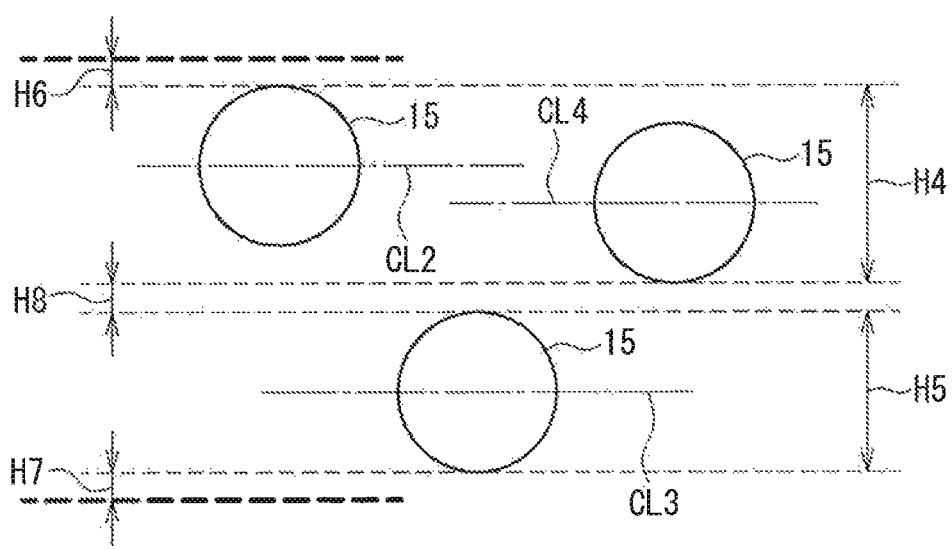
FIG. 7B is a diagram illustrating the anchor effect in the device of this embodiment.

FIG. 7A is a diagram illustrating the anchor effect in Comparative Example 2. FIG. 7B is a diagram illustrating the anchor effect in the device of this embodiment.

As illustrated in FIG. 7A, three projections 15' are placed with their respective centers being located on a line CL1. When the projections 15' are placed on the same line parallel to the horizontal direction of FIG. 7A, the resistance to the peel force (anchor effect) is exerted only in the range of the width "H1" (i.e., the diameter of the projections 15') in FIG. 7A. On the other hand, the resistance to the peel force is not exerted in the range of the width "H2" and in the range of the width "H3" in FIG. 7A due to the absence of the projection 15'. Therefore, it is highly probable that peeling of the sealing film 14 will occur in the portion in which no projection 15' is present.

As illustrated in FIG. 7B, three projections 15 are placed with their respective centers not being located on the same line in this embodiment. The projection 15 on the left of FIG. 7B has the center located on a line CL2. The projection 15 in the middle of FIG. 7B has the center located on a line CL3. The projection 15 in the right of FIG. 7B has the center located on a line CL4. Thus, in this embodiment, the resistance to the peel force (anchor effect) can be exerted in the range of the width "H4" and in the range of the width "H5" in FIG. 7B. Moreover, as indicated by the widths "H6" and "H7" in FIG. 7B, the region in which no resistance to the peel force is exerted can be smaller in this embodiment than in Comparative Example 2 as illustrated in FIG. 7A.

As described above, in this embodiment, three projections 15 are placed with their respective centers not being located on the same line. This configuration can improve the function of the three projections 15 to prevent the sealing film 14 from peeling off and can more reliably prevent the occurrence of peeling of the sealing film 14.

In the organic EL display device 1 of this embodiment having the above configuration, the projections (preventing portion) 15 that are configured to prevent the sealing film 14 from peeling off and to have the inclined plane 15c forming an obtuse angle with the light emitting surface of the organic EL element (electroluminescent element) 4 are provided only in the non-light emitting region of the organic EL element 4. Thus, unlike the conventional example, the organic EL display device (electroluminescent device) 1 of this embodiment can prevent the occurrence of peeling of the sealing film 14. Consequently, in this embodiment, the function of the sealing film 14 to seal the organic EL element 4 can be maintained for a long time, so that the degradation of the organic EL element 4 can be more reliably reduced. Therefore, this embodiment can easily provide the organic EL display device 1 with high reliability In this embodiment, the preventing portion includes a plurality of projections 15 that are covered with the sealing film 14 and project in the direction from the organic EL element 4 to the sealing film 14. These projections 15 can reliably prevent the occurrence of peeling of the sealing film 14.

In this embodiment, each subpixel P has three projections 15. These projections 15 can more reliably prevent the occurrence of peeling of the sealing film 14.

[Embodiment 2]

Figure 8:
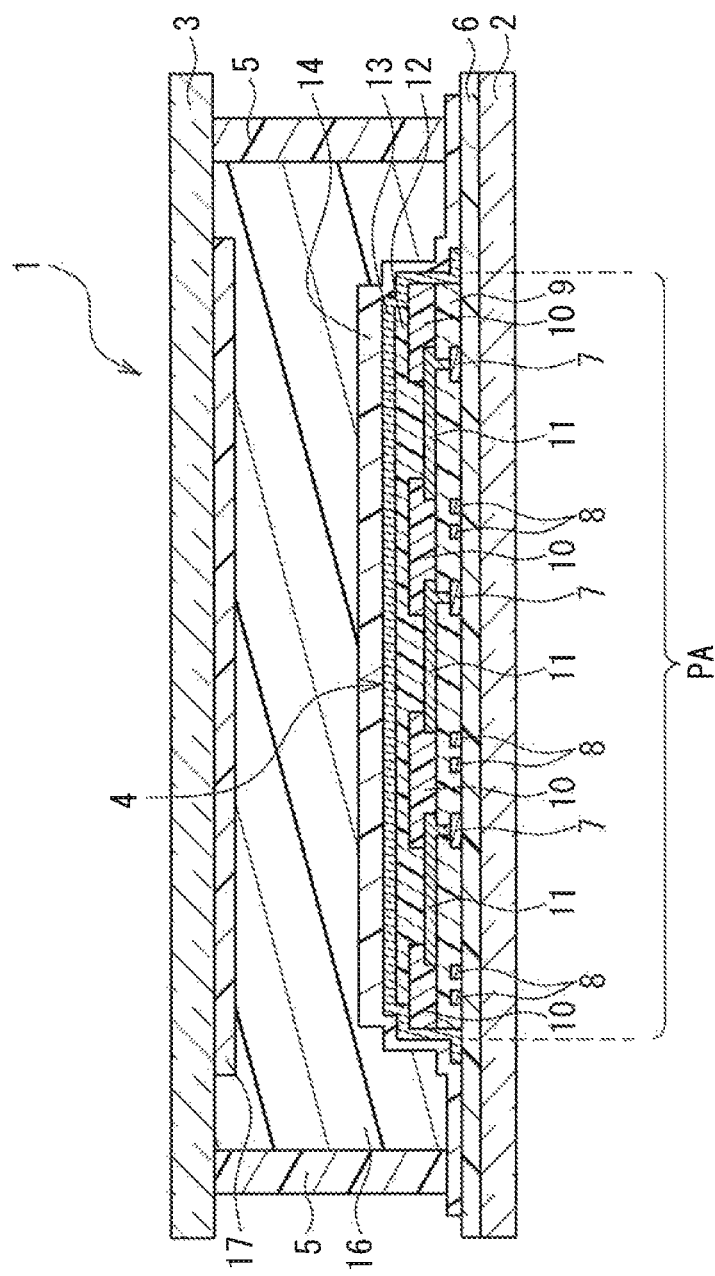
FIG. 8 is a cross-sectional view illustrating a cross section in light emitting regions of an organic EL display device of Embodiment 2 of the present invention.
Figure 9:
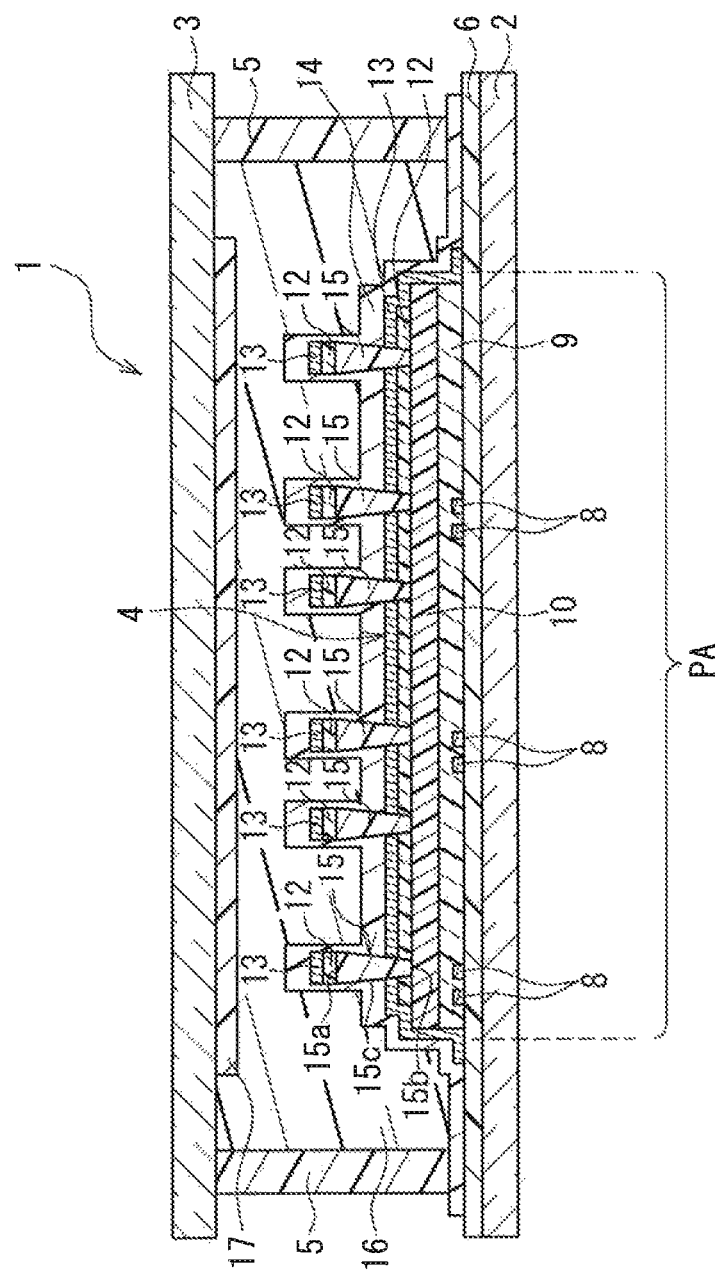
FIG. 9 is a cross-sectional view illustrating a cross section in a non-light emitting region of the organic EL display device in FIG. 8.

FIG. 8 is a cross-sectional view illustrating a cross section in light emitting regions of an organic EL display device of Embodiment 2 of the present invention. FIG. 9 is a cross-sectional view illustrating a cross section in a non-light emitting region of the organic EL display device in FIG. 8.

In FIGS. 8 and 9, this embodiment mainly differs from Embodiment 1 in that the organic EL element is sealed by a counter substrate that is located opposite the TFT substrate, and a sealing material that is provided between the TFT substrate and the counter substrate. The same components as those of Embodiment 1 are denoted by the same reference numerals, and the explanation will not be repeated.

As illustrated in FIGS. 8 and 9, an organic EL display device 1 of this embodiment includes a counter substrate 3 that is located opposite a TFT substrate 2, and a sealing material 5 that is provided between the TFT substrate 2 and the counter substrate 3. An organic EL element 4 is sealed by the TFT substrate 2, the counter substrate 3, and the sealing material 5. The organic EL display device 1 of this embodiment includes a filler 16 that is filled into a space between the TFT substrate 2, the counter substrate 3, and the sealing material 5, and a color filter 17 that is disposed on the counter substrate 3 so as to face the organic EL element 4.

Unlike Embodiment 1, in the organic EL display device 1 of this embodiment, a pixel region PA is surrounded by the sealing material 5 after the formation of a sealing film 14, subsequently the filler 16 is injected, and then the counter substrate 3 provided with the color filter 17 is bonded. The organic EL element 4 is sealed in this structure and protected against moisture or oxygen from the outside. Thus, this embodiment can reduce the degradation of the organic EL element 4 and improve the reliability of the organic EL display device 1. Moreover, this embodiment can ensure the reliability with the simple sealing film 14, and therefore can reduce the cost of the sealing film formation process.

Similarly to the TFT substrate 2, the counter substrate 3 is made of, e.g., a glass material. The sealing material 5 is made of, e.g., a material with low moisture permeability. The filler 16 is made of e.g., a material with low moisture permeability or a material containing a drying agent or an oxygen absorbent. The filler 16 may be either a curable type or a non-curable type. When the filler 16 is a non-curable type, the filler 16 present between the TFT substrate 2 and the counter substrate 3 is in the liquid state.

The color filter 17 has the function of modulating light emitted from the organic EL element 4. Specifically, the color filter 17 includes red, green, and blue color filter portions. For example, when the organic EL element 4 emits white light, the color filter 17 modulates the white light into red light, green light, and blue light in the corresponding red, green, and blue subpixels Pr, Pg, and Pb by the red, green, and blue color filter portions, respectively.

For example, when the organic EL element 4 emits red light, green light, and blue light from the red, green, and blue subpixels Pr, Pg, and Pb, respectively, the color filter 17 further modulates these colors of light through the corresponding red, green, and blue color filter portions. Thus, it is possible to enhance the color purity of each color and to suppress the shift of color tone at the time of changing the viewing angle.

The formation of the color filter 17 may be omitted if the organic EL element 4 emits a single color of light, or there is no problem in the color purity and color tone of light emitted from the organic EL element 4.

The color filter 17 is disposed in the following manner. First, the color filter 17 is aligned with the TFT substrate 2 so that the positions of the red, green, and blue color filter portions agree with the positions of the red, green, and blue subpixels Pr, Pg, and Pb provided on the side of the TFT substrate 2 that faces the organic EL element 4, respectively. Then, the TFT substrate 2 and the counter substrate 3 are bonded together.

With the above configuration, this embodiment can have the same effects as those of Embodiment 1. In this embodiment, the organic EL element 4 is sealed by the TFT substrate 2, the counter substrate 3, and the sealing material 5. Therefore, it is possible to further prevent moisture or oxygen from entering the organic EL element 4 from the outside, and to further reduce the degradation of the organic EL element 4 caused by moisture or oxygen.

In this embodiment, the filler 16 is located on the sealing film 14. Therefore, stress is applied to the sealing film 14 due to a difference in thermal expansion coefficient between the sealing film 14 and the filler 16 or cure shrinkage (when a curable type filler is used). This stress also acts on the portions (interfaces) with low adhesion of films such as a portion between the first electrode 11 and the organic EL layer 12, a portion between each of the layers of the organic EL layer 12, and a portion between the second electrode 13, the organic El layer 12, and the sealing film 14, and can cause peeling of the sealing film 14. However, in this embodiment, similarly to Embodiment 1, each subpixel has, e.g., three projections (preventing portion) 15 (see FIG. 9). Therefore, the projections 15 can effectively exert the anchor effect on the sealing film 14 and can prevent the sealing film 14 from peeling off. Consequently, similarly to Embodiment 1, this embodiment can provide the organic EL display device 1 with high reliability.

[Embodiment 3]

Figure 10:
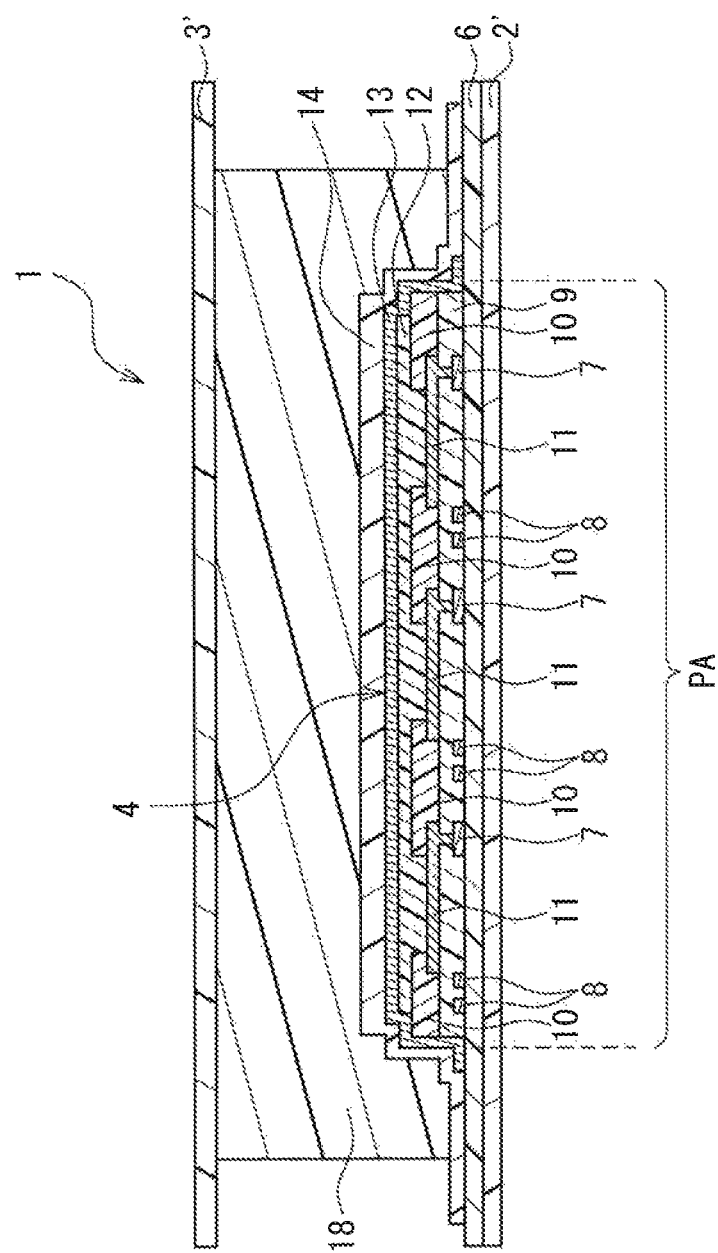
FIG. 10 is a cross-sectional view illustrating a cross section in light emitting regions of an organic EL display device of Embodiment 3 of the present invention.
Figure 11:
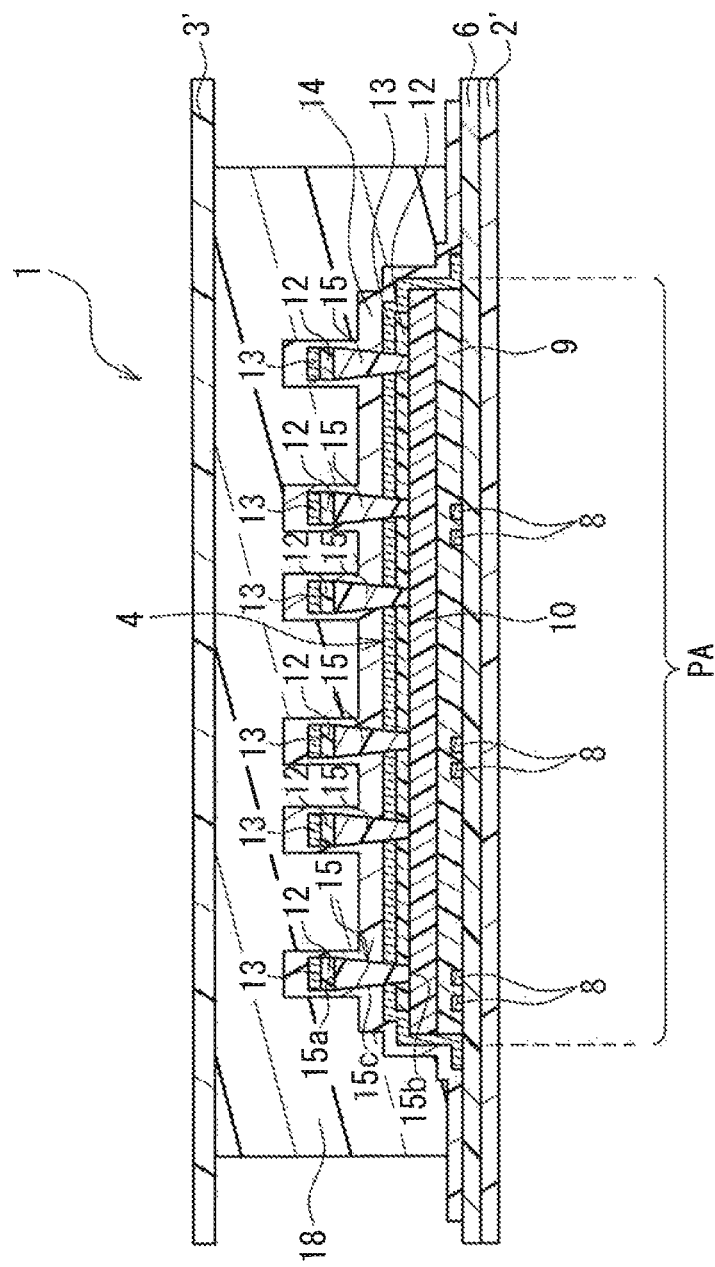
FIG. 11 is a cross-sectional view illustrating a cross section in a non-light emitting region of the organic EL display device in FIG. 10.

FIG. 10 is a cross-sectional view illustrating a cross section in light emitting regions of an organic EL display device of Embodiment 3 of the present invention. FIG. 11 is a cross-sectional view illustrating a cross section in a non-light emitting region of the organic EL display device in FIG. 10.

In FIGS. 10 and 11, this embodiment mainly differs from Embodiment 2 in that the TFT substrate and the counter substrate are flexible substrates. The same components as those of Embodiment 2 are denoted by the same reference numerals, and the explanation will not be repeated.

As illustrated in FIGS. 10 and 11, an organic EL display device 1 of this embodiment includes a TFT substrate 2' and a counter substrate 3' that are made of a flexible substrate or a material having flexibility such as a film. In the organic EL display device 1 of this embodiment, a sealing film 14 is formed on the TFT substrate 2', and then the counter substrate 3' is bonded with an adhesive 18. With this configuration, the organic EL display device 1 of this embodiment can have flexibility.

Other than the above description, similarly to Embodiment 2, a color filter may be disposed on the surface of the counter substrate 3' that faces the TFT substrate 2' in order to modulate light emitted from an organic EL element 4. In this case, similarly to Embodiment 2, the TFT substrate 2' and the counter substrate 3' are bonded together with the adhesive 18 after the alignment of red, green, and blue subpixels Pr, Pg, and Pb.

The surface of the counter substrate 3' that faces the TFT substrate 2' may be covered with a gas barrier film that is formed of e.g., silicon nitride or silicon oxynitride. In this case, it is possible to reduce the amount of moisture or oxygen entering the organic EL element 4 through the counter substrate 3' from the outside. Thus, this embodiment can reduce the degradation of the organic EL element 4 and improve the reliability of the organic EL display device 1. Moreover, this embodiment can ensure the reliability with the simple sealing film 14, and therefore can reduce the cost of the sealing film formation process.

Similarly to Embodiment 2, a sealing material may be used to surround a pixel region PA. The sealing material with low moisture permeability can reduce the amount of moisture or oxygen entering the end portions of the bonded TFT substrate 2' and counter substrate 3' from the outside. Thus, this embodiment can reduce the degradation of the organic EL element 4 and improve the reliability of the organic EL display device 1.

With the above configuration, this embodiment can have the same effects as those of Embodiment 2. In this embodiment, the TFT substrate 2' and the counter substrate 3' are flexible substrates. Therefore, the organic EL display device 1 of this embodiment can have flexibility.

In this embodiment, the adhesive 18 is located on the sealing film 14. Therefore, stress is applied to the sealing film 14 due to a difference in thermal expansion coefficient between the sealing film 14 and the adhesive 18 or cure shrinkage. This stress also acts on the portions (interfaces) with low adhesion of films such as a portion between the first electrode 11 and the organic EL layer 12, a portion between each of the layers of the organic EL layer 12, and a portion between the second electrode 13, the organic El layer 12, and the sealing film 14, and can cause peeling of the sealing film 14. However, in this embodiment, similarly to Embodiment 1, each subpixel has, e.g., three projections (preventing portion) 15 (see FIG. 11). Therefore, the projections 15 can effectively exert the anchor effect on the sealing film 14 and can prevent the sealing film 14 from peeling off. Consequently, similarly to Embodiment 1, this embodiment can provide the organic EL display device 1 with high reliability.

[Embodiment 4]

FIGS. 12A and 12B are a perspective view and a side view of a display device including an organic EL display device of Embodiment 4 of the present invention, respectively. FIG. 13 is an enlarged plan view illustrating the main configuration of the organic EL display device in the boundary portions F1 and F2 in FIG. 12A.

Figure 12:
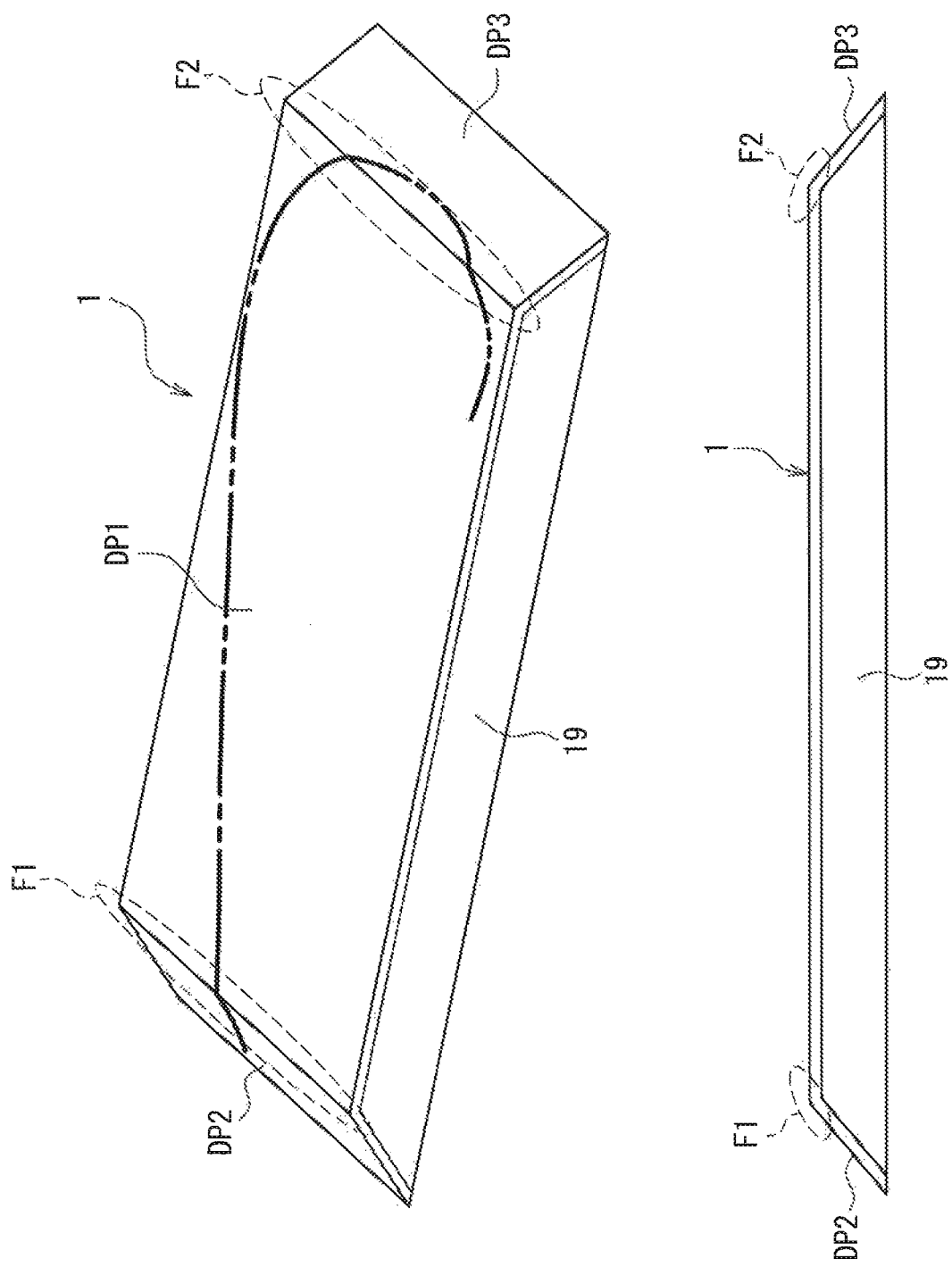
FIGS. 12A and 12B are a perspective view and a side view of a display device including an organic EL display device of Embodiment 4 of the present invention, respectively.
Figure 13:
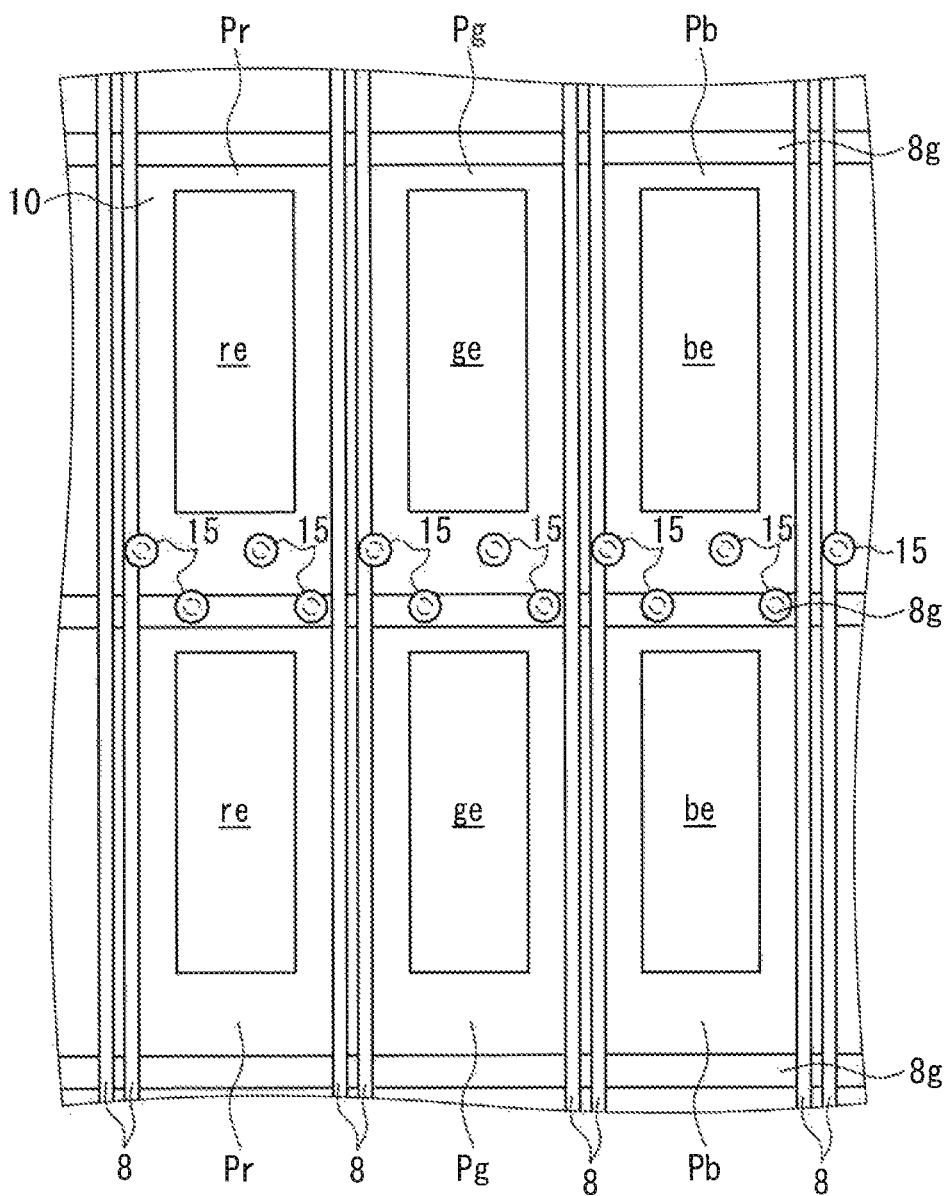
FIG. 13 is an enlarged plan view illustrating the main configuration of the organic EL display device in the boundary portions F1 and F2 in FIG. 12A FIGS. 14A and 14B are a plan view and a side view of Modified Example 1 of the projection, respectively.

In FIGS. 12 and 13, this embodiment mainly differs from Embodiment 3 in that it relates to an organic EL display device in which an end face of a display surface is also formed as a light emitting surface. Specifically, the organic EL display device of this embodiment includes a standard light emitting surface and an inclined light emitting surface that is continuously formed on an end face of the standard light emitting surface, and is inclined with respect to the standard light emitting surface. Moreover, in this embodiment, the density of placement of the projections of the preventing portion is larger in a boundary portion between the standard light emitting surface and the inclined light emitting surface than in a portion of the standard light emitting surface other than the boundary portion and a portion of the inclined light emitting surface other than the boundary portion. The same components as those of Embodiment 3 are denoted by the same reference numerals, and the explanation will not be repeated.

As illustrated in FIGS. 12A and 12B, an organic EL display device 1 of this embodiment includes a standard light emitting surface DP1 and inclined light emitting surfaces DP2, DP3. The inclined light emitting surfaces DP2, DP3 are continuously formed on the end faces, e.g., the right and left short sides of the standard light emitting surface DP1, and are inclined with respect to the standard light emitting surface DP1. In other words, both end portions of the flexible organic EL display device 1 of Embodiment 3 are bent and attached to a case 19, thereby providing the organic EL display device 1 with the standard light emitting surface D1 and the inclined light emitting surfaces DP2, DP3. As indicated by the alternate long and two short dashes line in FIG. 12A, the organic EL display device 1 of this embodiment can display one Japanese syllabary character "つ" (tsu) on the standard light emitting surface DP1 and the inclined light emitting surfaces DP2, DP3.

In FIGS. 12A and 12B, "F1" represents a boundary portion between the standard light emitting surface DP1 and the inclined light emitting surface DP2, and "F2" represents a boundary portion between the standard light emitting surface DP1 and the inclined light emitting surface DP3. In this embodiment, the density of placement of the projections 15 is larger in the boundary portions F1, F2 than in the portion of the standard light emitting surface DP1 other than the boundary portions F1, F2 and the portions of the inclined light emitting surfaces DP2, DP3 other than the boundary portions F1, F2.

Specifically, as illustrated in FIG. 3, three projections 15 are provided for each subpixel P in the portion of the standard light emitting surface DP1 other than the boundary portions and the portions of the inclined light emitting surfaces DP2, DP3 other than the boundary portions.

On the other hand, as illustrated in FIG. 13, four projections 15 are provided for each subpixel P in the boundary portions F1, F2. Thus, the density of placement of the projections 15 in the boundary portions F1, F2 is increased so that the occurrence of peeling of the sealing film 14 can be prevented even if the end portions of the standard light emitting surface DP1 are bent to form the inclined light emitting surfaces DP2, DP3.

With the above configuration, this embodiment can have the same effects as those of Embodiment 3.

Other than the above description, the inclined light emitting surfaces may be formed, e.g., not only on the short sides, but also on the long sides of the standard light emitting surface DP1.

The above embodiments are all illustrative and not restrictive. The technical scope of the present invention is defined by the appended claims, and all changes that come within the range of equivalency of the claims are intended to be embraced therein.

For example, in the above description, the organic EL element is used as an electroluminescent element. However, the present invention is not limited thereto, and may use, e.g., an inorganic EL element including an inorganic compound.

In the above description, the present invention is applied to the active matrix type organic EL display device including the TFTs (thin-film transistors) 7. However, the present invention is not limited thereto, and may be applied to a passive matrix type organic EL display device including no thin-film transistor.

In the above description, the present invention is applied to the organic EL display device. However, the present invention is not limited thereto, and may be applied to, e.g., an illuminating device such as a backlight device.

In the above description, each subpixel has three or four cylindrical projections with the inclined plane. However, the present invention may use any preventing portion that is provided only in the non-light emitting region of the electroluminescent element, has an inclined plane forming an obtuse angle with the light emitting surface of the electroluminescent element, and prevents the sealing film from peeling off.

Specifically, e.g., each subpixel may have at least one strip-shaped projection, as illustrated in FIG. 6A.

However, as described with reference to FIG. 6B, a plurality of projections provided for each subpixel is preferred because they can more reliably prevent the occurrence of peeling of the sealing film.

As illustrated in FIGS. 14A and 14B, the present invention may also use a prismatic projection 35 having an upper surface 35a that is in contact with the organic EL layer, a lower surface 35b that is in contact with the edge cover, and an inclined plane 35c that forms an obtuse angle with the light emitting surface of the organic EL element (electroluminescent element). When such a prismatic projection 35 is used, the projection 35 can easily be formed because the design is simple.

As illustrated in FIGS. 14C and 14D, the present invention may also use a cross columnar projection 45 having an upper surface 45a that is in contact with the organic EL layer, a lower surface 45b that is in contact with the edge cover, and an inclined plane 45c that forms an obtuse angle with the light emitting surface of the organic EL element (electroluminescent element). When such a cross columnar projection 45 is used, the inclined plane 45c can be longer in the same area, and thus the anchor effect can easily be improved.

As illustrated in FIGS. 14E and 14F, the present invention may also use a hexagonal columnar projection 55 having an upper surface 55a that is in contact with the organic EL layer, a lower surface 55b that is in contact with the edge cover, and an inclined plane 55c that forms an obtuse angle with the light emitting surface of the organic EL element (electroluminescent element). When such a hexagonal columnar projection 55 is used, a close-packed structure can easily be achieved, facilitating an increase in the ratio of the area taken up by the projection 55.

In the above description, the projections (preventing portion) are provided in the non-light emitting region between two vertically adjacent subpixels P in FIG. 3. However, the non-light emitting region of the present invention is not limited thereto, and may be either a non-light emitting region between two horizontally adjacent subpixels P in FIG. 3 or a non-light emitting region outside the pixel region.

Other than the above description, Embodiments 1 to 4 may be combined as needed.

INDUSTRIAL APPLICABILITY

The present invention is useful for an electroluminescent device that can prevent the occurrence of peeling of a sealing film.

DESCRIPTION OF REFERENCE NUMERALS

1 Organic EL display device
2, 2' TFT substrate (substrate)
3, 3' Counter substrate
4 Organic EL element (electroluminescent element)
5 Sealing material
14 Sealing film
14a First inorganic layer
14b Organic layer
14c Second inorganic layer
15, 25, 35, 45, 55 Projection (preventing portion)
15c, 25c, 35c, 45c, 55c Inclined plane
P, Pr, Pg, Pb Subpixel
DP1 Standard light emitting surface
DP2, DP3 Inclined light emitting surface

The invention claimed is:

1. An electroluminescent device comprising:
a substrate; and
an electroluminescent element provided on the substrate,
wherein the electroluminescent device comprises a sealing film that seals the electroluminescent element, and a preventing portion that is configured to prevent the sealing film from peeling off and to have an inclined plane forming an obtuse angle with a light emitting surface of the electroluminescent element, and
wherein the preventing portion is provided only in a non-light emitting region of the electroluminescent element.

2. The electroluminescent device according to claim 1, wherein the preventing portion includes a plurality of projections that are covered with the sealing film and project in a direction from the electroluminescent element to the sealing film.

3. The electroluminescent device according to claim 2, wherein the plurality of projections of the preventing portion are provided for each subpixel in the electroluminescent element.

4. The electroluminescent device according to claim 3, wherein the plurality of projections of the preventing portion are provided for each subpixel so that an area ratio Sr of the inclined plane calculated by the following formula (1) is 3% or more:

$$Sr = (S1 - S2)/S3 \quad (1)$$

where S1 represents an area of surfaces of the projections that face the sealing film, S2 represents an area of surfaces of the projections that face the electroluminescent element, and S3 represents an area of the subpixel.

5. The electroluminescent device according to claim 3, wherein when the preventing portion includes three or more projections for each subpixel, the three or more projections are placed with their respective centers not being located on a same line.

6. The electroluminescent device according to claim 2, wherein the light emitting surface of the electroluminescent element includes a standard light emitting surface and an inclined light emitting surface that is continuously formed on an end face of the standard light emitting surface, and is inclined with respect to the standard light emitting surface, and
a density of placement of the projections of the preventing portion is larger in a boundary portion between the standard light emitting surface and the inclined light emitting surface than in a portion of the standard light emitting surface other than the boundary portion and a portion of the inclined light emitting surface other than the boundary portion.

7. The electroluminescent device according to claim 1, comprising:
a counter substrate that is located opposite the substrate; and
a sealing material that is provided between the substrate and the counter substrate,
wherein the electroluminescent element is sealed by the substrate, the counter substrate, and the sealing material.

8. The electroluminescent device according to claim 7, wherein the substrate and the counter substrate are flexible substrates.

9. The electroluminescent device according to claim 1, wherein the sealing film includes an inorganic layer and an organic layer that are stacked one on top of the other.

10. The electroluminescent device according to claim 1, wherein the sealing film has a thickness of 2 μm or more.

* * * * *